United States Patent [19]

Scott et al.

[11] Patent Number: 5,344,365
[45] Date of Patent: Sep. 6, 1994

[54] INTEGRATED BUILDING AND CONVEYING STRUCTURE FOR MANUFACTURING UNDER ULTRACLEAN CONDITIONS

[75] Inventors: Richard G. Scott; Craig R. Shackleton; Raymond W. Ellis, all of Austin, Tex.

[73] Assignee: Sematech, Inc., Austin, Tex.

[21] Appl. No.: 121,621

[22] Filed: Sep. 14, 1993

[51] Int. Cl.$^5$ .......................... B01L 1/04; F24F 7/007
[52] U.S. Cl. .................................... 454/187; 454/193
[58] Field of Search ............... 454/187, 193, 188, 189, 454/190

[56] References Cited

U.S. PATENT DOCUMENTS

| | | | |
|---|---|---|---|
| 3,588,176 | 6/1971 | Byrne et al. | 302/2 |
| 3,603,646 | 9/1971 | Leoff | 302/29 |
| 3,812,947 | 5/1974 | Nygaard | 198/19 |
| 3,930,684 | 1/1976 | Lasch, Jr. et al. | 302/2 |
| 3,976,329 | 8/1976 | Adams et al. | 302/2 |
| 3,976,330 | 8/1976 | Babinski et al. | 302/2 |
| 4,081,201 | 3/1978 | Hassan et al. | 302/2 |
| 4,165,132 | 8/1979 | Hassan et al. | 406/10 |
| 4,211,505 | 7/1980 | Babinski et al. | 406/19 |
| 4,278,366 | 7/1981 | Loveless et al. | 406/88 |
| 4,299,518 | 11/1981 | Wheland | 406/62 |
| 4,315,705 | 2/1982 | Flint | 406/73 |
| 4,348,139 | 9/1982 | Hassan et al. | 406/10 |
| 4,409,889 | 10/1983 | Burleson | 98/33 |
| 4,501,527 | 2/1985 | Jacoby et al. | 414/225 |
| 4,554,766 | 11/1985 | Ziemer et al. | 52/28 |
| 4,573,830 | 3/1986 | Richardson et al. | 406/84 |
| 4,618,292 | 10/1986 | Judge et al. | 406/19 |
| 4,649,830 | 3/1987 | Tanaka | 104/138.1 |
| 4,682,927 | 7/1987 | Southworth et al. | 414/217 |
| 4,695,215 | 9/1987 | Jacoby et al. | 414/225 |
| 4,722,659 | 12/1988 | Hoyt, III et al. | 414/416 |
| 4,804,392 | 2/1989 | Spengler | 55/356 |
| 4,826,360 | 5/1989 | Iwasawa et al. | 406/51 |
| 4,840,530 | 6/1989 | Nguyen | 414/404 |
| 4,851,018 | 7/1989 | Lazzari et al. | 55/356 |
| 4,861,222 | 8/1989 | Mirkovich | 414/648 |
| 4,865,491 | 9/1989 | Sakurai | 406/87 |
| 4,867,629 | 9/1989 | Iwasawa et al. | 454/187 |
| 4,875,825 | 10/1989 | Tullis et al. | 414/786 |
| 4,917,227 | 4/1990 | Matsuo et al. | 198/347 |
| 4,923,352 | 5/1990 | Tamura et al. | 414/225 |
| 4,958,716 | 9/1990 | Matsuo et al. | 198/346 |
| 4,963,069 | 10/1990 | Wurst et al. | 414/416 |
| 4,964,776 | 10/1990 | Wakita et al. | 414/277 |
| 5,058,491 | 10/1991 | Wiemer et al. | 98/115.3 |
| 5,096,477 | 3/1992 | Shinoda et al. | 55/385.2 |
| 5,108,513 | 4/1992 | Muller et al. | 134/15 |
| 5,145,303 | 5/1992 | Clarke | 454/187 |
| 5,167,575 | 12/1992 | MacDonald | 454/187 |
| 5,261,167 | 11/1993 | Sckata | 454/187 |

FOREIGN PATENT DOCUMENTS

| | | |
|---|---|---|
| 3712064 | 10/1988 | Fed. Rep. of Germany ......... H01L 21/68 |
| 3826925 | 2/1990 | Fed. Rep. of Germany ... F24F 7/00 |
| 4017006 | 11/1991 | Fed. Rep. of Germany .......... B65G 49/07 |
| 60-161825 | 8/1985 | Japan . |
| 61-124404 | 6/1986 | Japan . |
| 61-263503 | 11/1986 | Japan ............................. B65G 1/02 |

OTHER PUBLICATIONS

A Proposal from Tohoku University, Break Through, "Break Through for Scientific Semiconductor Manufacturing in 2001", 1992 05 No. 71, Special Issue on 2001 Semiconductor Manufacturing.

Microcontamination, "Wafers in the Round: A Fresh Approach to Fab Design and Operation", Mike Hinsley, Jun. 1986, pp. 12–15.

*Primary Examiner*—Henry C. Yuen
*Attorney, Agent, or Firm*—William W. Kidd

[57] ABSTRACT

A building houses a semiconductor manufacturing facility, which is circular in shape and is of a multi-story structure. A silo is located at the center for use in storing and transferring wafers to clean rooms disposed radially around the silo at each floor. Human access is not permitted in the silo and in the clean rooms in order to prevent contamination of the wafers. Due to the modularity of the clean room structures, clean rooms can be reconfigured easily without significant impact on the on-going manufacturing operation. The modularity also permits portions of the facility to be deactivated when not needed.

23 Claims, 5 Drawing Sheets

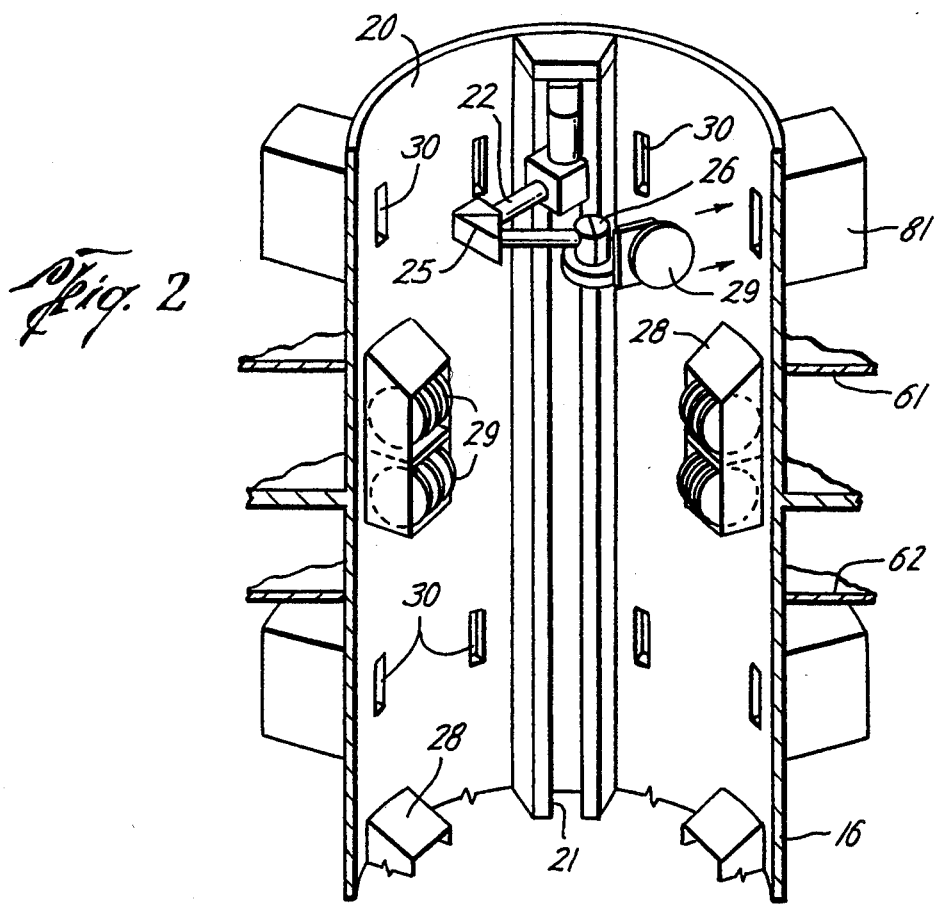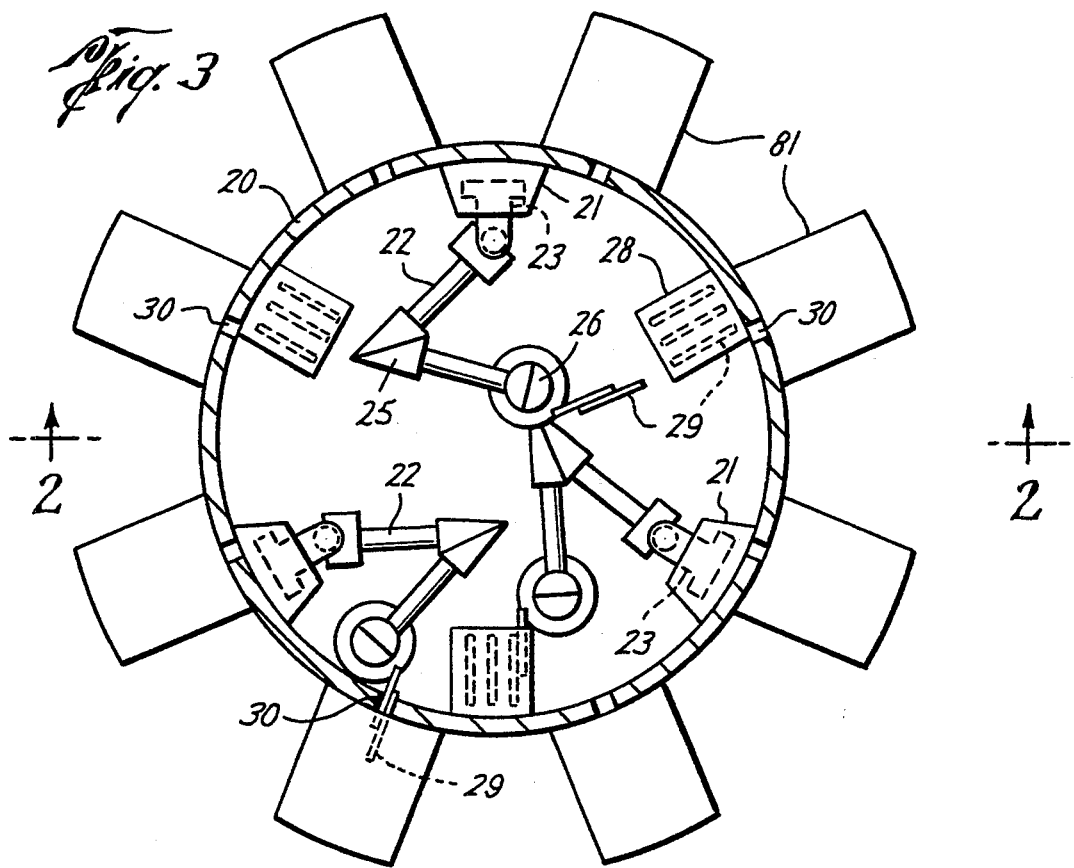

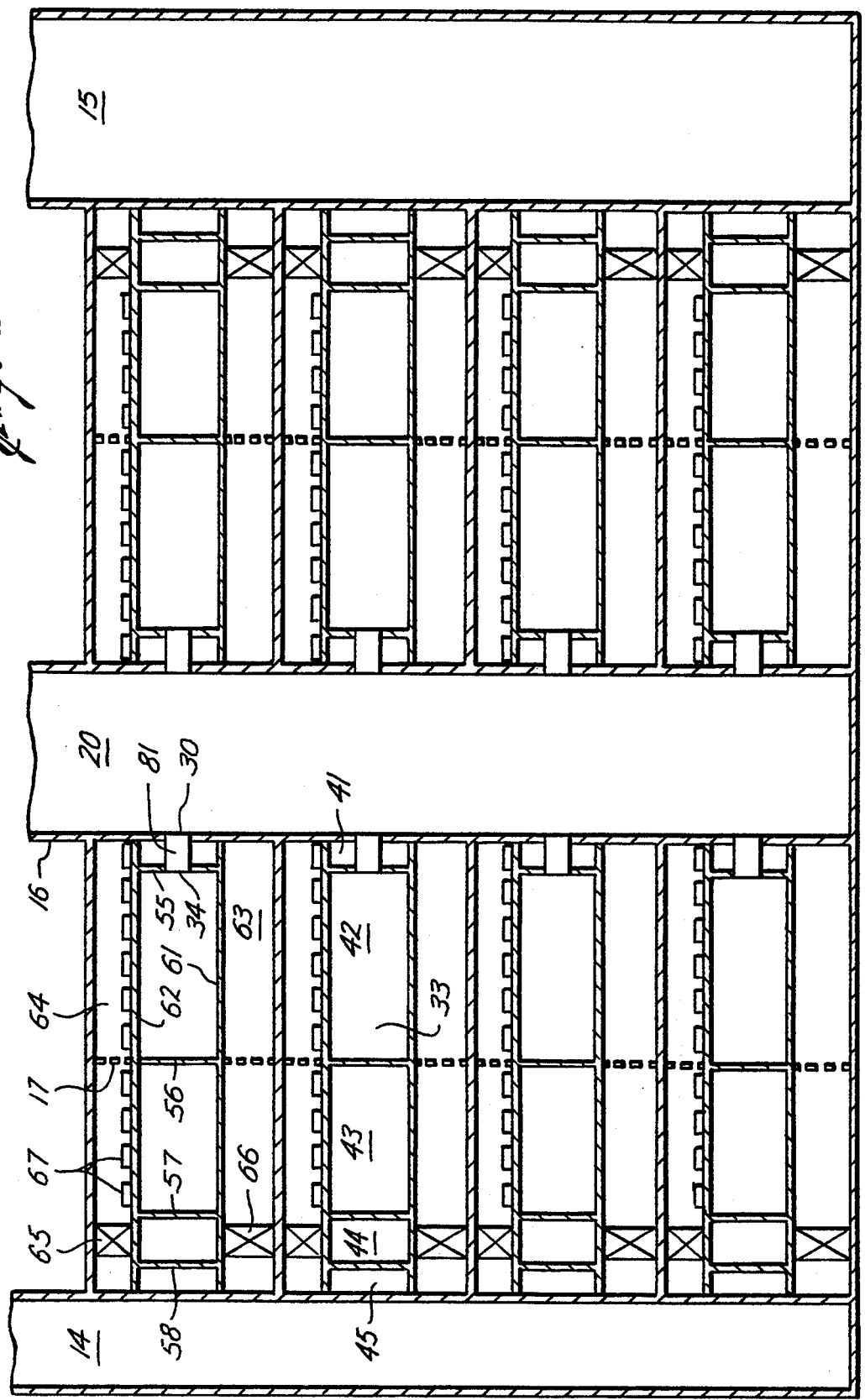

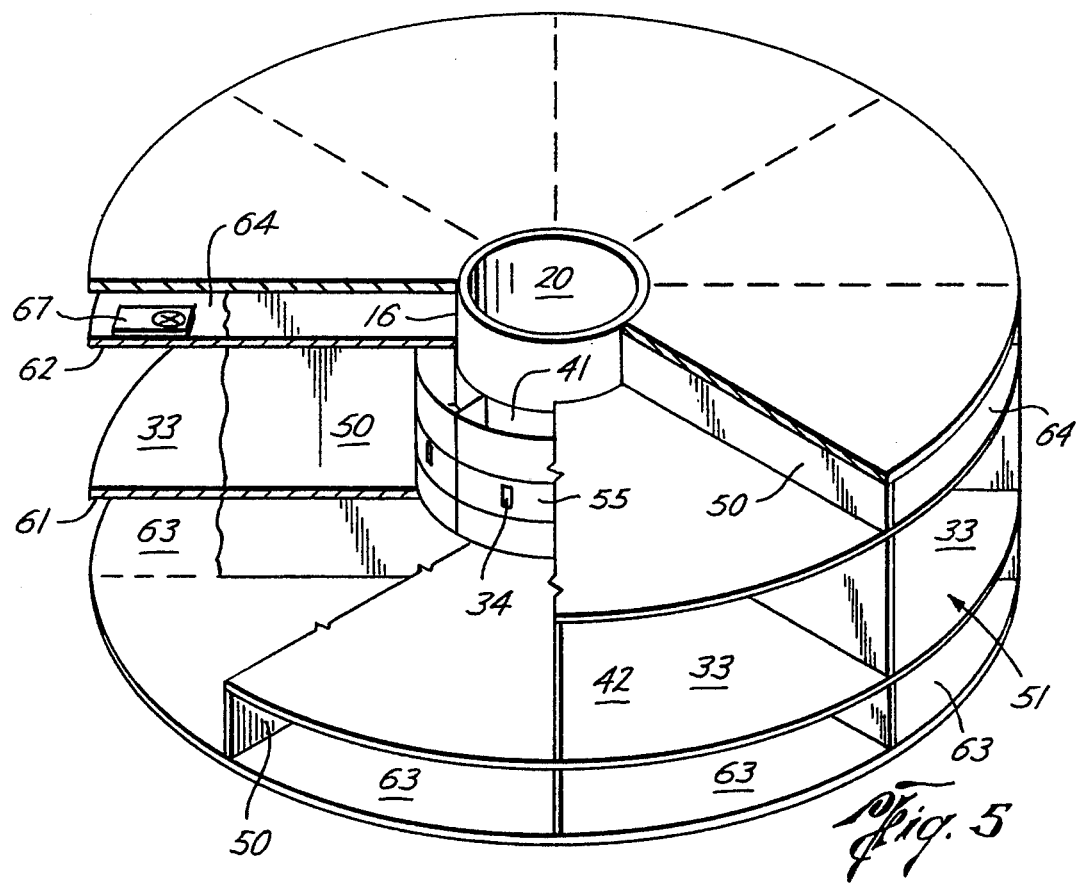
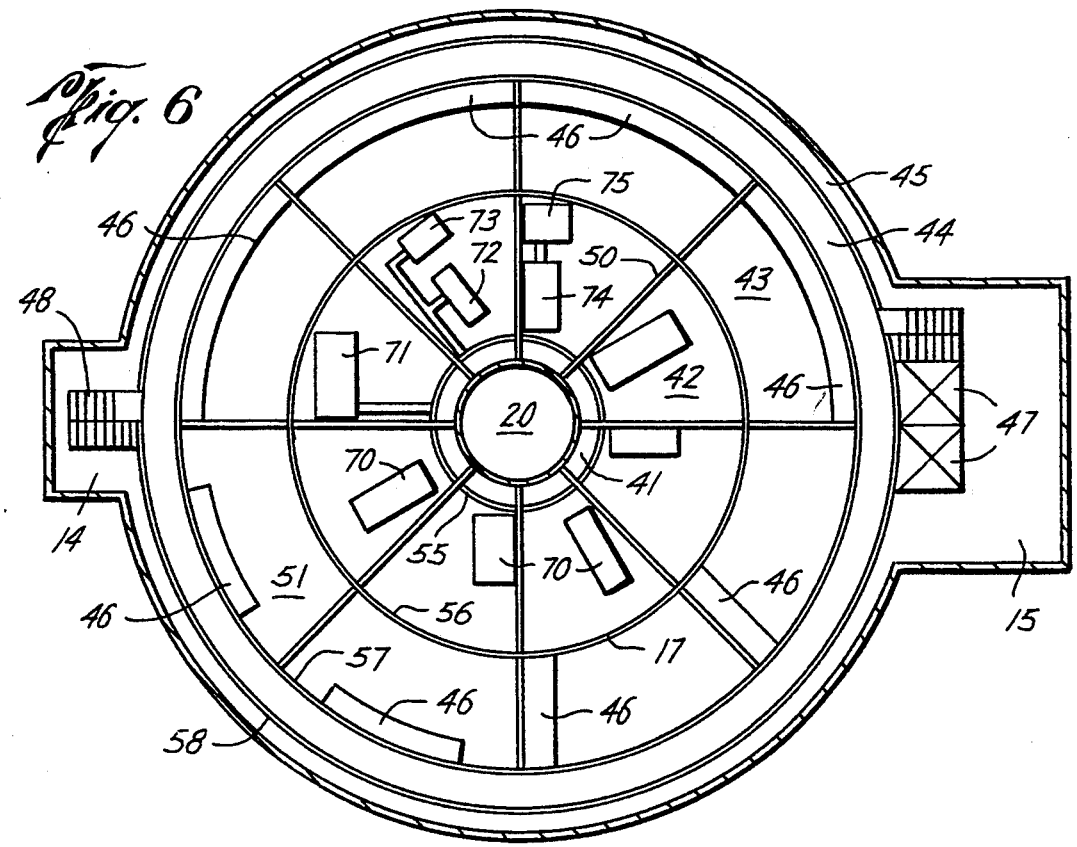

INTEGRATED BUILDING AND CONVEYING STRUCTURE FOR MANUFACTURING UNDER ULTRACLEAN CONDITIONS

BACKGROUND OF THE INVENTION

1. Field of the Invention

The present invention relates to the field of buildings utilized for manufacturing products and, more particularly, to a facility for fabricating semiconductor devices.

2. Prior Art

Semiconductor devices, which include integrated circuits, are manufactured in "clean room" environments in order not to contaminate the devices being fabricated. These fabrication facilities are commonly referred to as "fabs" and their degree of cleanliness is designated by a rating standard. These standards are defined relevant to a "Class" number and are based on the number of contaminating particles tolerated in a given volume of air. The lower the Class number, the cleaner the room. Generally, the cleanest of the clean rooms today have a designation of Class 1.

The various semiconductor fabs throughout the world generally follow a fairly standard design in the layout of the clean room facility. A manufacturing area of the fab is designated to have the cleanest environment in order not to contaminate the various devices being fabricated on the semiconductor wafers. This manufacturing area has controlled access in order to reduce the amount of human presence, which can be a significant contributor of contamination in a fab. To maintain this high level of cleanliness, the manufacturing area is designed to have a zone ("room") above the ceiling and a zone below its floor. Essentially, the floor of the lower zone is at ground level and the floor of the manufacturing area is suspended at a predetermined height above the ground level. Thus, the manufacturing area appears to be a fully contained enclosure suspended above a floor with an open area above the ceiling.

Additionally, equipment and instruments necessary for the distribution of liquids and gases to the various wafer processing equipment are located outside of this contained enclosure and piped in above or below the enclosure to various processing equipment located in the manufacturing area. A containment area, such as a trench, is typically constructed in the lower zone to collect any liquids which may spill from the manufacturing area residing above.

All or portions of the floor and ceiling panels of the clean room have small openings for the passage of forced air. Typically, air is forced downward from the upper zone above the ceiling, through the clean room, out through the suspended floor and into the lower zone. This air is then filtered, recycled back up to the upper area and forced downward again. Because the filtered air in the clean room is replaced a number of times each minute, the manufacturing area is relatively free of contaminating particles. The degree of cleanliness will depend on the amount and type of air filtering used and the controls placed on the generation of contaminants within the manufacturing area.

Due to the ease in which contaminants can be introduced or produced in this clean environment, a number of schemes have been devised to reduce the presence of contaminants in the actual area where wafers or devices are present. Foremost is the restrictions placed on human access. For those entering a clean area, a rigorous entry procedure must be followed, including a dressing procedure in which individuals put on clothing commonly known as "bunny suits." One of the causes of contamination in the clean room is due to the presence of humans in the clean room. Thus, even with the utmost care in the use of the equipment, chemicals etc., humans continually introduce contaminants into the fab.

Other means of controlling the presence of contaminants is by the segregation or isolation of contaminating sources. For example, one technique is to have two or more zones of cleanliness. The wafers are kept in the cleaner (or cleanest) zone, while sources which do not come in contact with the wafer are kept in the less cleaner zones. Thus, maintenance corridors and support areas within a fab are isolated from the wafer processing areas of the clean room.

A more advanced method currently uses a SMIF (Standard Mechanical InterFace) technique to isolate the wafer from the environment. Generally, this technique requires the wafers to be encased in clean enclosures when being stored or transported. Although this technique helps to reduce the amount of contamination, the wafers are always susceptible to contamination since it is difficult to maintain the cleanliness integrity of the enclosures. A state-of-the-art integrated circuit manufacturing facility, generally showing the current design and use of a clean room, is described in U.S. Pat. No. 5,058,491.

Another factor for consideration is from a materials handling viewpoint. Generally, the existing fabs were designed with a central consideration for human access. Equipment location and facility support were then designed in to the fab with constant regard for human access to the equipment. A wafer management system was implemented in order to "move" the wafers through the fab. The process flows of these wafers are generally linear and have resulted in inefficiencies which are characteristic of linear process flow systems.

One solution for overcoming a linear process flow system is to devise a circular system. One such implementation of a circular system is to devise a circular fab. An early design philosophy for a circular fab is described in "Wafers In The Round: A Fresh Approach To Fab Design And Operation", Hinsley, Microcontamination, pp 12–15, June 1986. In this approach the control computer and wafer storage are located at the hub. The various processing equipment are then located adjacent to the spines radiating from the hub.

A more advanced design for a circular fab is described by Professor Tadahiro Ohmi in "Break Through For Scientific Semiconductor Manufacturing In 2001", A Proposal from Tohoku University, Special Issue on 2001 Semiconductor Manufacturing, 1992. Professor Ohmi describes a circular centered single-column fab for production of 220,000 wafers/month in a clean room having an area of 20,000 square meters. This design describes a central transport tower surrounded by process equipment and tools located in the clean area. "Spines" or tunnels are used to transport wafers to the equipment. A piping zone is located below the clean room, while air filters are located above the ceilings. Filtered air flow provides for laminar air flow from the ceiling in order to keep the equipment area ultra clean. The air return under the clean room floor provides for recirculation of the air in the fab.

Although the design is circular and the transport tower is centrally located, the Ohmi design still relies on a number of existing practices which are based on the current premise relating to clean room philosophy. That premise being that the clean room is one large production floor where human access is vital for proper operation and management of the equipment. Thus, in order to isolate the wafer from surrounding contamination, transport tunnels are utilized to transport the wafers from the central tower to the various processing equipment on the clean room floor.

The present invention is a radical departure from the existing practice of designing a fab around human access. The present invention places the paramount importance upon the management of the wafer and provides for a fab which attempts to remove human access from the actual wafer processing areas. Although the present invention relates to the concept of a circular fab, the modularity of the fab, as well as its multi-story structure, provides for a means of maintaining an important control over the manufacturing environment.

SUMMARY OF THE INVENTION

A building having a circular ultra-clean semiconductor manufacturing facility with a wafer silo and modular clean rooms is described. The manufacturing facility is circular in shape and has a silo at its center for transporting and storing semiconductor wafers. Radially disposed around the silo on each level are modular segments, each containing a clean room and its maintenance zone. Each segment also includes an interface for effecting the transfer of wafers between the clean rooms and the wafer silo. The building also includes a facility support area at its base and an office complex adjacent to it.

In this multiple-story structure, the centrally located wafer silo is utilized as a wafer management system to disperse wafers to the various clean rooms for performing process tasks appropriate for a given clean room. Openings in the silo correspond to the various clean rooms distributed around the silo on each floor of the manufacturing facility. The clean rooms mate to the silo openings through its interface.

Radially outward from the processing zone, which contains the clean rooms, are maintenance/support areas for the clean rooms. A walkway runs along the outer perimeter of the maintenance/support zone for permitting human access to each of the modular segments. However, human operators are not permitted into the clean room where wafers are processed, except for equipment installation or maintenance. Finally, at the outer most perimeter of the circular structure is a zone for air, gas and utilities distribution, which are generally fed from the facility support area located at the base through two vertical snorkels.

The circular facility is structured so that the cleanest environment is encountered at the center with succeeding circular zones having lower cleanliness ratings. Thus, the silo has the cleanest requirement, next followed by the clean rooms. These two areas are kept ultra-clean, since wafers are present in these zones. Further, human access is prohibited where wafers are present, in order to prevent contamination caused by human presence.

In the preferred embodiment, ultra-pure inert gas, such as nitrogen, is used in the silo, while ultra-pure air is recirculated in the clean rooms. In order to isolate the two different environments during wafer transfer between the silo and the clean rooms, an enclosed container containing a wafer shuttle is used. The container functions as a sealed interface between the silo and the clean room. The container is purged and filled with air or nitrogen depending on which environment opening is to be mated for the transfer of a wafer. A wafer shuttle (actually two shuttles in this instance) located between the opposing sealed openings in the container, ferries the wafer between the silo and the clean room to effect the transfer.

Due to the modularity of the structures surrounding the central silo, partitions and walls can be quickly removed to reconfigure the size of the clean rooms. Furthermore, due to the modularity and independent control of air gas, etc. entering each processing area, each clean room module can be deactivated ("shut down") without significantly affecting ongoing operations. This modularity allows for one manufacturing facility design for production of variety of semiconductor products.

Economic Advantage: ultimately, the practice of the present invention results in lower overall cost per square centimeter of wafer processed for the life of a fabrication facility and improved production yield.

BRIEF DESCRIPTION OF THE DRAWINGS

FIG. 2 is an axial view showing the interior of a wafer management and storage silo of the fabrication facility and also showing multi-level transport robots and modular storage units within the silo.

FIG. 3 is a cross-sectional view of the silo and showing three robotics arms within the silo.

FIG. 4 is a cross-sectional view of the fabrication facility of the present invention showing the layout of several floors of the multi-story structure.

FIG. 5 is a pictorial cut-away view showing one manufacturing floor of the fabrication facility.

FIG. 6 is a cross-sectional view of the fabrication facility and showing examples of tool and operator room layouts on one floor of the facility.

DETAILED DESCRIPTION OF THE PREFERRED EMBODIMENTS

A building having a circular ultra-clean semiconductor manufacturing facility with a central wafer management system is described- In the following description, numerous specific details are set forth, such as specific shapes, materials, tools, compositions, etc., in order to provide a thorough understanding of the present invention. However, it will be obvious to one skilled in the art that the present invention may be practiced without these specific details. In other instances, well known processes and structures have not been described in detail in order not to unnecessarily obscure the present invention.

Figure 1:
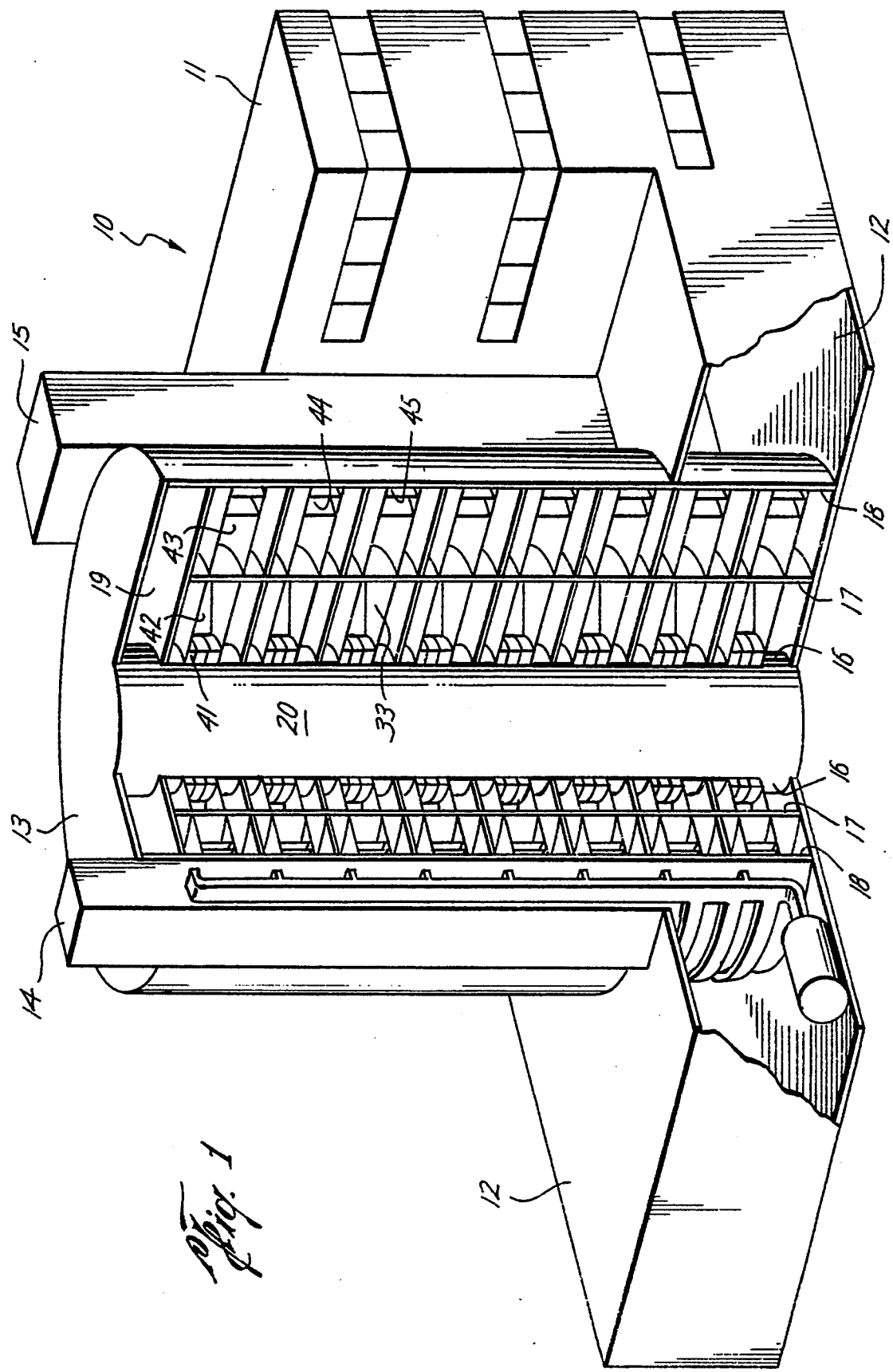
FIG. 1 is a pictorial diagram of a semiconductor manufacturing building of the present invention and showing a cut-away view of a fabrication facility.

Referring to FIG. 1, a building 10 housing a semiconductor fabrication facility of the present invention is shown. The building 10 is comprised of an office complex 11, a facility support area 12 and a fabrication facility 13 (which is also referred to as a "fab"). Two utilities snorkels 14 and 15 extend upward from the base of the facility support area 12 and function as extensions of the facility support area 12.

As is shown in FIG. 1, the fab 13 is circular in shape and is a multi-story structure. The circular fab is surrounded at its base by the facility support area 12. The two snorkels 14 and 15 rise upward from the base along the outer circumference of the circular shape of the fab 13. Theses snorkels 14–15 are shown opposite to each other in FIG. 1, but the actual number of snorkels or their location is a design choice. What is imperative is that the snorkels provide utilities access to all of the floors of the structure of fab 13. Furthermore, in FIG. 1, snorkel 15 also includes within its structure an elevator 47 (actually two separate elevators which are shown in FIG. 6) for transporting people, materials and equipment to and from the various floors. Again, the inclusion of an elevator 47 in a given snorkel, as well as the actual number of elevators is a design choice. Furthermore, stairwells 48 (which are also shown in FIG. 6) are included as well in each of the snorkels 14–15 for floor access and emergency egress.

Adjacent to the support area 12 is the office complex for housing people who are associated with the operation, engineering and administration of the fab 13. The office complex can be located adjacent to or distant from the fab 13, but the preference is to have it connected to the fab 13. As shown in FIG. 1, the office complex is connected to facility support area 12 at the location of snorkel 15. The proximity to snorkel 15, which contains the elevator(s) 47, allows for minimal walking distance between the office complex 11 and the various floors of fab 13.

The purpose of the facility support area 12 is to house the various equipment, as well as the storage of chemicals, which are required for supporting the operation of the fab 13. Such equipment will usually include electrical generators, air circulation equipment, air conditioners, fluid storage tanks, fluid distribution units, gas cabinets, environmental and safety monitors, and waste recycling and/or disposal systems. Such services and systems for supporting a fully-functional fab, as well as the office complex 11, are well known in the prior art. Air intake and air exhaust vents are not shown, but are essential for the operation of fab 13 and other areas of building 10. The number, size and location of such air vents are strictly a design choice.

Although the support area 12 surrounds the base of the circular structure of fab 13, it is regarded as a separate unit from fab 13 and is separated by the outer supporting frame 18 of fab 13. Generally in the prior art, vibration generating equipment, such as generators and motors, are kept at a discrete distance from the actual fab in order not to interfere with the operation of sensitive equipment, such as optical lithography equipment. Although this practice is acceptable with the fab of the present invention, it is preferable that the support area 12 house all of the necessary facility support equipment, in order to maintain an integrated complex within one building structure. As will be noted below, kinematically isolated frames are used in order to dampen vibrations, since such vibration damping is essential for the proper operation of the more vibration sensitive semiconductor processing equipment. The distribution of various gases, liquids, waste and air circulation from the support area 12 to the various floors of the fab 13 are achieved by the pipes and ducts distributed up through the snorkels 14 and 15.

As is shown in the cut-away view portion of FIG. 1, a circular core (silo) 20 is located at the hub of the circularly shaped fab 13. This silo 20 extends substantially the full height of fab 13 and forms the wafer management engine of the present invention. The purpose of silo 20 is to provide for the storage and transport of semiconductor wafers which are to be processed on the various floors of fab 13.

Also referring to FIGS. 2 and 3, interior portions of the silo 20 are detailed. As is noted in the figures, silo 20 is cylindrical in shape and extends substantially the height of fab 13. Also extending the height of silo 20 are a plurality of vertical tracks 21. In the particular example, three independent tracks are shown spaced 120 degrees apart around the interior of silo 20. Each track 21 includes a robotics arm 22 for the purpose of manipulating the movement of wafers within silo 20. Each arm 22 is capable of movement along the length of its corresponding track 21 in order to transport wafers to any level of fab 13.

Furthermore, each arm 22 is capable of extending outward away from its track 22 to reach interior areas of silo 20. As shown in the particular example, each arm 22 is mounted onto the track 21 by a transport base 23. Each arm 22 also has joints 24–26 which allow each connecting segment to pivot, as well as swivel, in order to permit the arm to transport wafers within silo 20.

It is to be appreciated that although three separate tracks are shown, the actual number used is a design choice. Also, a variety of prior art robotics devices can be readily adapted to provide the arm 22 shown in the figures. However, it is imperative that the arms 22 are capable of operating within silo 20 without interfering with each other. Thus, in the present example, each arm 22 is normally retained in its contracted position adjacent to its track 21 and is extended only when reaching for a position to retrieve or deliver a wafer.

Disposed along the periphery of silo 20 are a plurality of openings 30. Each of the openings 30 is for the purpose of transferring the wafers between silo 20 and an adjacent clean room 33. Accordingly, a series of openings are disposed around silo 20 at each floor level of fab 13. The actual number of openings at each level will depend on the number of partitioned clean rooms 33 located at that level. As will be evident, it is preferred to have at least one opening 30 for each partitioned clean room 33, but such number of openings is a design choice.

Also along the interior of silo 20, at locations where openings 30 are not present, modular material storage units 28 are disposed on the interior wall of silo 20. As shown in the drawings, wafers 29 are shown stored within storage units 28. It is to be noted that a variety of wafers, including unfinished wafers, can be stored in the storage units 28. Further, if desired, other devices can be readily adapted for storage within silo 20. With the practice of the preferred embodiment, each robotics arm 22 is designed to access storage units 28 adjacent to its track 21 and those openings 30 which are also proximal to its track 21. However, such manipulation of the arms 22 and its reach are strictly a design choice.

As will be evident to those skilled in the art, once a raw wafer is introduced into silo 20, it is maintained in the ultra-clean environment of silo 20. The wafer is transported by the multi-level transport mechanism, which is the arm 22 in the preferred embodiment, to a particular opening 30 corresponding to a given clean room 33 that contains a tool for performing a processing step(s). Then, the wafer 29 is transported to another clean room 33 for performing the next processing step(s) or returned to one of the storage units 28 within silo 20. Eventually, when the wafer 29 is completely finished, it can be removed from fab 13. Thus, it is evident that the wafers are always maintained in an ultra-clean environment (barring some unplanned break in the integrity of the ultra-clean environment) of silo 20 and clean room 33. The wafers are prevented from coming into human contact, since human access to silo 20, as well as to clean room 33, is not permitted during normal operation.

The interior of the silo 20 is maintained as an ultra-clean environment, having a class 1 or sub-Class 1 (Class 0.x) rating for cleanliness. Silo 20 can be designed to have air, gas or a vacuum environment. However, the preference is to have a positive pressure environment, in the event a leak develops. With fab 13 of the present invention, a non-reacting gas is preferable over air. It is also preferable to use a non-reacting gas, such as nitrogen, which can be safely vented to the atmosphere. Furthermore, similar to the air circulation in a clean room, the nitrogen is filtered and recycled within silo 20, in order to maintain its ultra-clean environment.

Referring to FIGS. 4–7, the structure of fab 13 is shown in greater detail. As was described above, the wafer transport silo 20 comprises the central core of fab 13. Surrounding the central core are a number of ringed areas, which boundaries are distinguished by concentric circles shown in the cross-sectional floor diagram of FIG. 6. These circular zones 41–45 form concentric zones around silo 20. The first zone adjacent to the silo 20 is a transfer zone 41. The next zone surrounding the transfer zone 41 is a process zone 42. The process zone 42 contains the equipment and tools which are needed to process the semiconductor wafers. The purpose of the transfer zone is to provide for the transfer of the wafers between silo 20 and the various processing tools located in the clean rooms 33 within process zone 42. Thus, the earlier described openings 30 noted at the periphery of silo 20 are located at the juncture of silo 20 and transfer zone 41.

Surrounding process zone 42 is a support zone 43. This support zone 43 generally contains support and maintenance equipment which are associated with the processing equipment of zone 42, but are not used for the processing of the wafers themselves. Since wafers are not processed by the support and maintenance equipment located in zone 43, these equipment are kept isolated from the clean rooms of zone 42. This support zone 43 can include operator rooms or areas where human operators are present (designated as areas 46 in FIG. 6).

Then, surrounding the support zone 43 is a zone 44 dedicated as a walkway for people. The walkway 44 is for the purpose of permitting personnel to travel around each floor of fab 13, as well as allowing for the movement of equipment around the floor and to the elevators 47. As is shown, elevators 47, located in snorkel 15, open onto the walkway 44 of each floor. The stairwells 48 are also connected to the walkway 44. The walkway 44 connects to the various operator rooms (or areas) 46 in order to allow operators and technicians to enter these areas 46 by the walkway 44.

Finally, surrounding walkway 44 is the utilities zone 45. The utilities zone 45 connects to the snorkels 14–15, such that utility lines, pipes, fluid distribution, ventilation, ducts and other facilities related functions are distributed from the snorkels 14–15 around the circular perimeter of fab 13.

Also noted in FIGS. 5–6 are spines which radiate outward from silo 20 and terminate at the interior wall of walkway 44. These spines are actually modular walls which function as partitions 50 for forming wedge-shaped segments 51 around silo 20. The segments 51 are comprised by partitioning sections of zones 41, 42 and 43, such that each segment 51 is completely isolated from the other segments. Partitions 50, as well as the walls 55–57 separating zones 41, 42 and 43, respectively, are air tight in order to form high integrity enclosures. Correspondingly, each partitioned wedge-shaped segment 51 forms a clean room 33 in the processing zone 42, its associated support area in zone 43, the interface at zone 41, which zone includes the opening 30 for transferring wafers between silo 20 and clean room 33.

Figure 7:
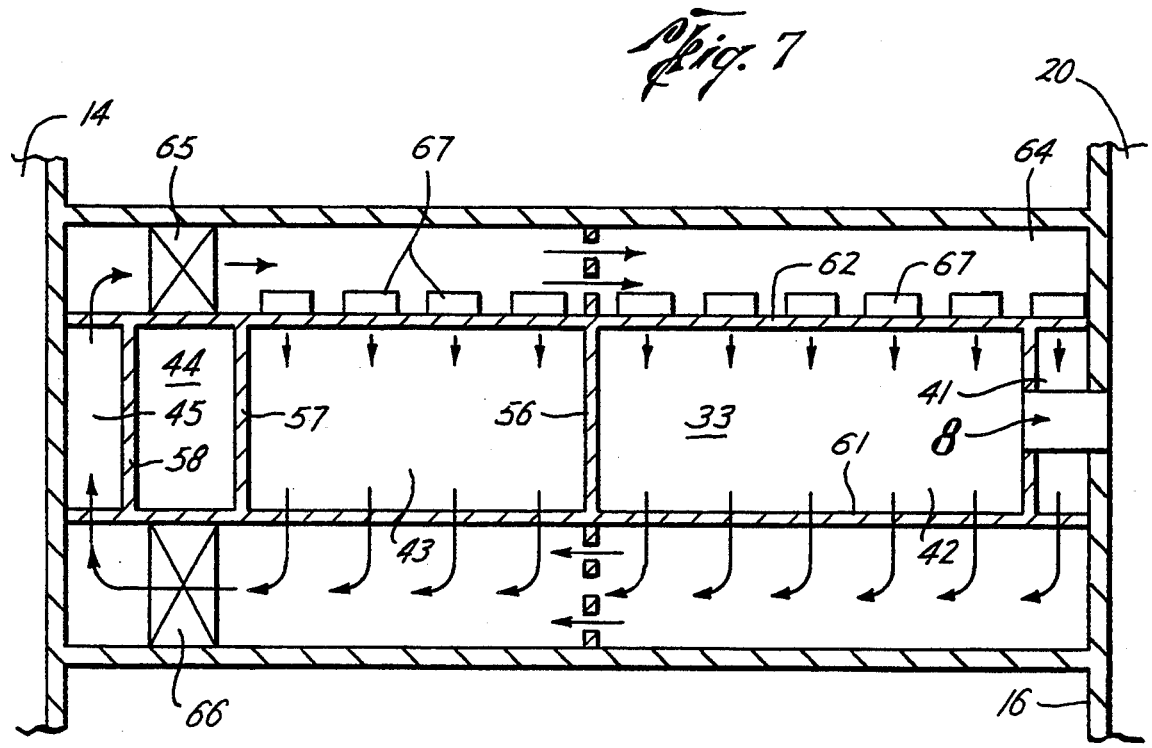
FIG. 7 is an cross-sectional, enlarged view showing one modular processing segment depicted in FIG. 4 and also showing direction of air flow within the segment.

The partitioned segments 51 are better illustrated in the drawings of FIGS. 5–7. Each segment 51 on a given level is positioned around the silo 20, such that an opening 30 in silo 20 is adjacent to the segment. The transfer zone 41 of each segment 51 is utilized as an interface between silo 20 and clean room 33 of the processing zone 42. This transfer zone is utilized for the transfer of wafers between silo 20 and clean room 33. It is possible to have the opening 30 open into the clean room 33, thus alleviating the need for a transfer zone 41. However, due to the differences described later, the preferred embodiment utilizes an intermediate interface in the manner of transfer zone 41. An opening 34 also exists at the wall 55, separating the transfer zone 41 and the processing zone 42, where clean room 33 is located for the passage of wafers into or out of clean room 33.

The clean room 33, containing the wafer processing tool, resides outward from the transfer zone 41. Another wall 56 then separates the clean room 33 from the support zone 43. As noted earlier, the support area of each segment may contain separate isolated areas or rooms where human operators can be stationed. As shown in FIG. 6, these operator areas 46 can be located in a variety of ways, but all being accessible from the walkway 44. Beyond the wall 57 of the support zone 43 is the walkway 44, which has an outer wall 58 separating it and the facilities zone 45.

The purpose of the various walls 55–58 and partitions 50 of the present invention can be appreciated if viewed in the context of a modular design in which the cleanest environment can be found at its center and the class of cleanliness decreases as one proceeds outward from the center. This layout is clearly understood when viewed in reference to FIG. 6. The cleanest environment is the wafer transport and storage area located within silo 20 of circular fab 13. As stated earlier, although air, vacuum or other gases can be utilized, the preferred embodiment utilizes ultra-pure nitrogen under positive pressure. This ultra-pure nitrogen environment can best be maintained by having a forced and filtered flow of nitrogen gas in the silo 20. Laminar flow is achieved by introducing nitrogen gas at the upper end of the silo 20 and the return gas collected at the bottom of the silo 20. Then through a return located under the base floor, the nitrogen is filtered and recirculated to the top of the silo again. An attic area 19 located above the highest floor level permits placement of filters, ducts and baffles for recirculating nitrogen. The silo environment is to have a Class 1 or Class 0.x (sub-Class 1) standard of cleanliness.

Subsequently, zones 41 and 42 are to have an ultra clean environment as well, since wafers are present in these zones. Class 10 or better standard of cleanliness is preferred. The present invention opts for Class 1. Human access to these zones 41–42 are also prohibited since wafers are present. The support zone 43 will have a Class 100+ standard of cleanliness. Cleanliness is important but not critical in zone 43, since wafers are not present. In some instances, such as when maintenance is required, human access is permitted in support zone 43.

The clean room and support areas of fab 13 operate in a similar manner to provide a laminar air flow in order to maintain a clean environment. As better noted in FIG. 7, the working areas of the fab are suspended above the floor. A floor panel 61 is suspended above the floor of each level so as to form an air return area 63 above the floor. A ceiling panel 62 is disposed some distance from the actual height of the ceiling for that level in order to form an air feed area 64 above the panel 62. The earlier described partitions and walls are placed between the two panels 61 and 62 to form the various partitioned areas of each wedge-shaped segment 51. The disposition of the clean room 33 and support zone 43 are not unlike the suspended enclosures known in the prior art and currently being implemented in existing manufacturing facilities.

The prior art technique of providing laminar air flow of filtered air to maintain an ultra-pure environment can be readily adapted for use with the present invention. Air flow, which is distributed around the facilities zone 45 from snorkel 14–15 are forced into the upper area 64. Fan/filter units 60 located above the upper panel 62 filter the air. The force provided by the fan blowers cause the air flow downward into the work areas, past the floor plate 61 and out into the return area 63. Openings in the ceiling and floor plates 61–62 permit the laminar flow of air through the work areas. The air is then collected and recycled back up to the upper area 64. The operation of filtering and circulating the flow of air in a clean room environment is well known in the prior art and such techniques can be readily adapted for use in providing clean areas of the present invention.

Furthermore, as noted in the illustration of FIG. 7, the degree of cleanliness can be readily controlled for each enclosed zone by controlling the filtering of the air entering that particular zone. Similarly, humidity can be controlled for each enclosed zone. It is also to be appreciated that by having baffle control on the fan/filter units 60, air circulation to each enclosed area of zones 41–43 can be easily shut off wherein allowing for independent controls on air circulation.

Additionally, fan/filter units 65–66 are configured above the ceiling and below the walkway 44 for each wedge-shaped segment 51. Fan/filter unit 65 is utilized to filter and force air from zone 45 into the upper air feed area 64, while fan/filter unit 66 is utilized to filter and force air out of the lower return area 63 and into zone 45. These fan/filter units 65–66 are baffled as well in order to control the air intake through unit 65 to the upper area 64 and air exhaust through unit 66 from the lower area 63. By closing off these baffles for a given segment 51, air circulation to that segment 51 can be closed off completely. Thus, a significant advantage of the present invention is in the segregation of each segment 51 into a minienvironment.

Accordingly, for a given floor level of fab 13, not all of the available clean rooms 33 need be utilized. This separation of each of the fab floors into a number of modular units permits fab operations of varying size. This modularity allows for portions of the fab 13 to be "closed off" when periods of excess capacity occurs. It also allows for equipment repair or replacement without completely shutting down the fab. Further, it allows for expansion when additional capacity is needed without a complete redesign of the fabrication facility.

It should be noted that each of these modular segments contains a separate clean room with its own support and operator areas. Each modular unit also includes its own air filtration system which can be altered or shut off as needed. Thus, each modular unit can operate essentially independent of others. The common elements to the modular units are the wafer management capability of silo 20 and the distribution of power, air, chemicals and fluid from the facility support area 12.

In order to obtain a significant number of these clean room modules without increasing the radius of the circular fab to an unmanageable size, the present invention provides for a multi-story structure to accommodate the necessary number of clean room modules. The actual number of floors is a design choice and will depend on the total floor area required for a given fab 13. It should be noted also that after the structure is completed, additional fab capacity can be obtained by vertically building additional floors onto the structure.

It is appreciated that it is critical to isolate and/or inhibit vibrations in order to prevent vibrations from interfering or disrupting certain process tasks. Therefore, it is preferable to kinematically isolate each floor from its adjacent floor(s). However it is almost essential to kinematically isolate the processing area from other areas which contain vibration sources. Thus, it is preferable to have kinematic frames 16 and 17 to isolate the processing zone 42 from the silo 20 and support zone 43. Pipes, ducts and distribution lines entering the processing zone 42 can be kinematically coupled/uncoupled as well at frames 16–17. The use of kinematic isolation is well-known in the art.

It should also be stressed that although the building 10 is shown rising up from the ground, the fab 13 can be constructed from the ground level down. In some parts of the world, this might be the preferred method.

Finally, it is appreciated that each of the modular areas can be configured to accommodate various tools to perform various processing steps. Referring to FIG. 6, examples of such tool and equipment placement are noted. Typically, one tool 70 is placed in each clean room 33. The tool can be a cluster tool for handling and processing multiple wafers. In this instance the tool will more than likely mate to the opening 30 or 34 for acceptance of the wafer. However, it is possible to have a tool, such as tool 71, away from silo 20. In such an instance, some automated feed must be available for interconnecting the tool 71 to silo 20 to transport the wafer. It is also possible to have more than one tool in a clean room, such as shown by tools 72–73 and 74–75. Again some automated transport means must be capable of transferring the wafer between the tools and possibly between a tool and the silo 20. A variety of known automated transfer schemes can be readily adapted for such interfacing.

Figure 8:
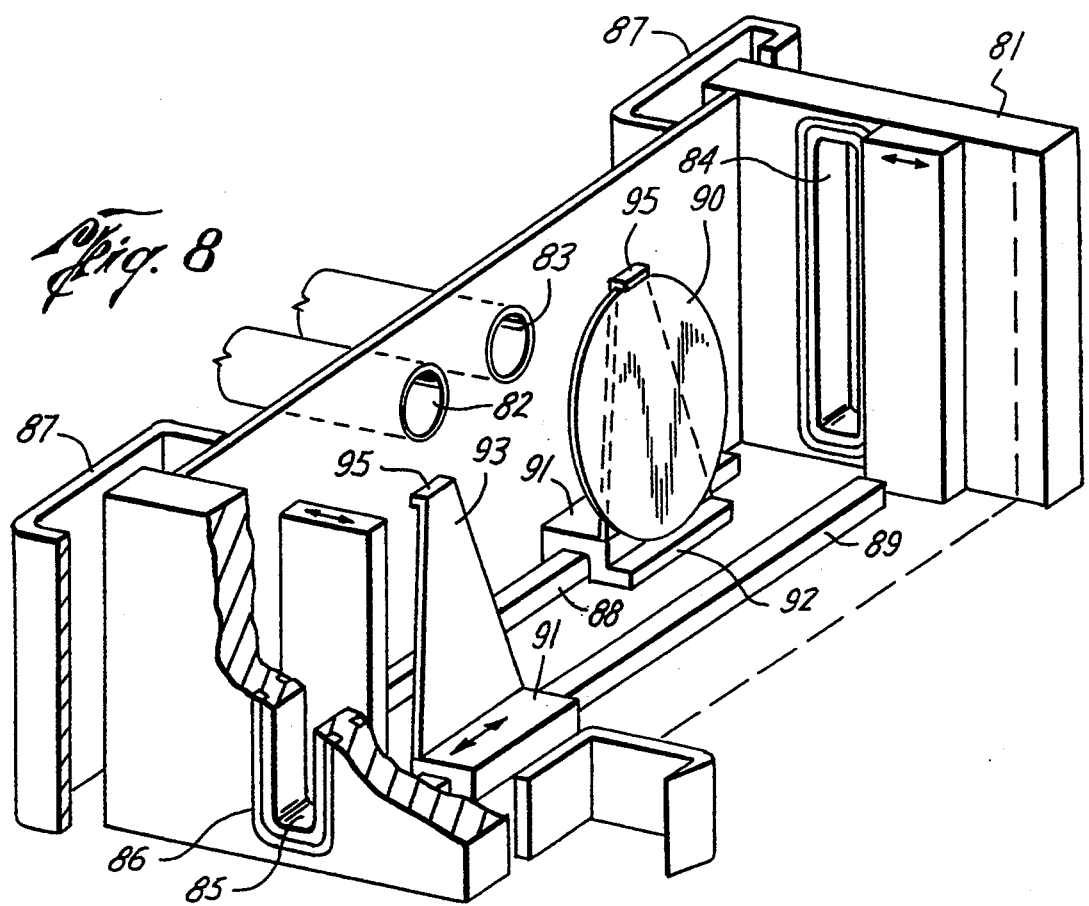
FIG. 8 is a pictorial view of a wafer shuttle utilized to shuttle wafers between the silo and clean rooms of the present invention.

Referring to FIG. 8, a wafer shuttle 80 of the present invention is shown. As was described earlier, the transfer zone 41 is utilized to transfer the wafer between the silo opening 30 and the clean room opening 34. It should be appreciated that the fab 13 of the present invention can be designed without this transfer zone 41. Alternatively, transfer zone 41 can be included as part of clean rooms 33, which then will interface directly with opening 30. In these instances, processing zone 42 would mate to the opening 30 and silo 20. However, the preferred embodiment relies on the use of the transfer zone 41 for an important reason. The transfer zone 41 is utilized in the present invention in order to isolate the air atmosphere of the clean room 33 from the nitrogen environment of silo 20. That is, the wafer shuttle 80 is used for the purpose of interfacing the two separate environments.

The shuttle 80 is encased in an enclosed, removable container 81 which has two gas inlet ports 82 and 83, as well as an exhaust port (not shown). An opening 84 at one end of the container 81 mates to the silo opening 30. A second opening 85 at the opposite end of container 81 mates to the clean room opening 34. Seals 86 are provided for providing tight sealing interfaces at openings 84–85. The container is placed into position and retained in position by clamps 87. The means for fastening the container 81 is a design choice and not critical to the operation of the invention.

Two rails 88 and 89 are disposed in parallel and run between the two openings 84 and 85. On each of the rails 88 and 89 is mounted a slidable wafer holder 91. Each wafer holder 91 is capable of accommodating one wafer 90 for transport between openings 84 and 85.

Although any one of a variety of designs can be readily adapted for the wafer holder 91, the preferred embodiment utilizes a holder having a flat base 92 and a vertical support member 93, which has an angled lip 95 at its upper end to retain wafer 90 against vertical support 93. The base 92 and vertical support member 93 are integral part of holder 91. Holder 91 rides upon rails 88 or 89 and the support member 93 is disposed at right angle to the base 92. The flat portion of the support member 93 is located proximate and planar to each of the openings 84 or 85 when it is placed adjacent to the opening 84 or 85.

The wafer 90, upon entering the opening 84 or 85 will have its edge reside on the base 92 and its flat surface rested against the support member 93. The wafer holders 91 are computer controlled to slide between the openings 84 and 85 to transport the wafer between the two openings 84 and 85. Robotics handlers, including arm 22, place and remove wafers on/from holder 91. It is appreciated that other techniques could be readily adapted to retain the wafer 90 on holder 91. For example, mechanical clamps or vacuum can be used.

It should also be emphasized that the mechanism for sliding the holders on rails 88 and 89 can be built under and external to the bottom of the container 81 in order not to introduce contaminants into container 81. Because of the difference of the two environments of the silo 20 and clean room 33, gas inlet ports 82 and 83 are used to purge the interior of the container 81 with the appropriate gas. Prior to accepting wafers from the silo 20, the interior of container 81 is flooded with ultra-pure nitrogen gas. Inlet port 83 is opened and nitrogen is introduced in the container 81. Then opening 84 is opened to the silo 20 for accepting a wafer. Actually, one or two wafers can be accepted since there are two wafer holders 91 in the design of FIG. 8. Then the air inlet port 82 is opened to flood the container with air.

The exhaust port is also opened at this time to exhaust the nitrogen. Once the container is filled with ultra clean air, opening 85 is opened to transfer the two wafers 90 to the clean room 33.

It is appreciated that the process is reversed for the transfer of wafers from the clean room 33 to silo 20. It should be noted also that two wafer holders 91 are utilized in order to transfer more than one wafer per gas exchange cycle, which does require some appreciable time to perform. Accordingly the actual number or the design of wafer transfer mechanisms, as well as the number of wafers to be transferred is a design choice. The shuttle 80 can be sized for handling a particular wafer size, such as 200 mm, but because of the modularity, it can be readily replaced with another sized shuttle if a different wafer size is to be accommodated. The components of the shuttle 80 can be constructed from a variety of materials suited for such purpose, including aluminum and stainless steel.

Many advantages are obtained from the practice of the present invention. Some of these advantages are enumerated below.

The present invention provides for a single, central, ultra-clean, laminar flow storage facility (in the form of a silo) with an independent filtration system and control. Although various products can be stored in this purified environment, the present invention is utilized for the storage of semiconductor wafers, specifically silicon wafers. Within the multi-story silo structure, robotics devices are used to transfer wafers to/from storage and to/from input/output ports adjacent to and adjoining the silo. These robots are made modular so that as few as one robot or as many as "n" number of robots may be utilized. These robots are utilized with the same "any article to any input/output port" functionality. This wafer transfer is accomplished in an automated environment in which human access is not permitted. Also, inoperative robots may be accessed and removed through an access tunnel located in the silo. It is to be appreciated that although the silo and the fab are described in relation to the manufacturing of semiconductor devices, the fab and/or the silo can be readily adapted for other types of articles as well.

Modular input/output passageway ports adjacent to and adjoining the silo provide for transfer of wafers between the silo and the clean rooms where the processing tool/and or equipment are located. These passageway ports are sealed and isolated in order to provide for an interface between two separate environments, since it is preferred to use ultra-clean nitrogen in the silo and ultra-clean air in the clean room. However, it should be noted that various environments can be utilized in the silo and clean rooms of the present invention. Since human access is not permitted in the clean rooms during normal operation, the clean rooms can be filled with nitrogen (or some other gas), if desired. The modularity of the input/output ports also provide for easy removal and replacement of these units.

The clean rooms are formed as modular processing structures adjacent to and adjoining the transfer passageways. The modularity of these processing structures allow for independently operated and maintained minienvironments, since air filtration and circulation can be controlled separately for each clean room. The clean rooms can be configured to various sizes, simply by the placement the side walls to a desired location. Single tools, cluster tools and/or multiple tools can be placed in each clean room. Furthermore, due to the modular design, clean rooms can be added or removed from the manufacturing operation without a complete shutdown of the fab. This modularity permits equipment repair or maintenance to be conducted without shutting the fab.

Modular process support/maintenance structures adjacent to and adjoining the process structures will have a separate circulation controls to isolate them from the clean rooms. Such modularity will allow the modular support/maintenance structure to be independently operated and maintained at a minimum filtration level without compromising the purity of other environments.

Humans are permitted to enter the support/maintenance structures to perform maintenance tasks. Operator rooms are designed within or adjacent to the support/maintenance structures for habitation by human operators in operating the process tools in the clean rooms. Operator access is permitted by the human access walkway circumscribing the periphery of the circular fab. Thus, layout planning (within limits) of clean room locations to minimize travel distances is unnecessary. A facility support zone along the outer most perimeter of the fab is connected to snorkels for feeding power, air, chemicals, fluids, exhaust, etc, which are needed for proper operation of the fab. The access can be from the walkway and/or from the snorkels.

The structural and robotics modularity allows for factory scaling without major redesign or operational interruption. A single-story or a multi-story fab can be constructed from the base design. If the fab must increase its maximum capacity capability, additional levels can be constructed axially, without the requirement of building a separate facility. During operation, modules can be added or subtracted, either radially or axially, without significant alteration of the structure.

In relation to the products being manufactured, the product can be handled individually or in batches depending upon the transfer system and the tools employed. The current state-of-the-art technology is moving toward single wafer processing, but with some exceptions, such as batch processing in furnaces. The product is completely isolated from the ambient environment and human contact once it enters the silo and remain so until completed. Due to the modularity of the fab, the same fab design can be used to construct fabs of varying size. Thus, small ASIC (Application-Specific Integrated Circuit) fabs and large high volume memory chip fabs can be constructed using the basic design. Mostly, the fab's central priority is on the management (and preferably automated management) of wafers and places a lower priority on human access and foot travel.

It is to be appreciated that in the practice of the present invention, it is preferred not to have human presence in the silo and the clean rooms. However, that does not mean that humans cannot be present. In certain circumstances, human presence may be desirable in these areas. Furthermore, it is to be noted that sealable doors are desirable for permitting access to the support rooms from the walkway (or the operator areas), as well as access from the support rooms to their respective clean rooms. The doors are sealable in order to provide the environmental integrity when the clean and support rooms are in use. As to the silo, if human presence is desired, it is imperative that air be present in the silo before any human access is permitted.

Although the present invention is described in reference to a semiconductor manufacturing facility, it can be readily adapted for other products without departing from the spirit and scope of the invention. Other ultra-pure manufacturing, such as for flat panel displays, can employ the use of the present invention. Instead of fabricating on a silicon or gallium arsenide (GaAs) substrate for semiconductor manufacturing, fabrication can be achieved on a glass substrate for flat panel display manufacturing. Furthermore, the facility employing the present invention need not be limited to the fabrication of microelectronic components or products and can be readily adapted to other product areas as well.

Thus, an integrated manufacturing facility employing modular building structures containing a number of individual and isolated minienvironments is described.

We claim:

1. A buildings for manufacturing microelectronic devices under an ultra-clean environment comprising:
    a central enclosure disposed therein for providing a central control area for dispersing of a material upon which said microelectronic devices are fabricated;
    a floor;
    a ceiling disposed above said floor;
    a plurality of partitioning walls radiating radially outward from said central enclosure and disposed to form a plurality of spines around said central enclosure, said partitioning walls coupled to said floor and said ceiling;
    a first separating wall disposed concentrically around said central enclosure and coupled to said floor, ceiling and plurality of partitioning walls, such that a plurality of fully enclosed clean rooms are formed concentrically around said central enclosure, said clean rooms for containing processing equipment for processing said material;
    each of said clean rooms being environmentally isolated from other of said clean rooms in order to form a minienvironment in each of said clean rooms, such that a breach of environmental integrity of one of said clean rooms does not disrupt environmental integrity of other of said clean rooms;
    said central enclosure and said clean rooms having flow of ultra-pure air or gas in order to maintain ultra-clean minienvironments;
    said central enclosure having an opening to each of said clean rooms for transferring said materials between said central enclosure and said clean rooms;
    an automated material handler coupled to said central enclosure for transporting said material within said central enclosure and between said central enclosure and said clean rooms through said openings;
    wherein said material is transported to various clean rooms for processing in said ultra-clean environment.

2. The building of claim 1 further comprising a second separating wall disposed concentrically around said first separating wall and coupled to said floor, ceiling and plurality of partitioning walls, such that a plurality of fully enclosed support rooms are formed outward and corresponding to each of said clean rooms in order to provide support areas for each of said clean rooms.

3. The building of claim 2 further comprising a third separating wall disposed concentrically around said second separating wall and coupled to said floor and ceiling in order to provide an access way around to said support areas.

4. The building of claim 3 wherein said clean rooms and support rooms include a suspended floor and ceiling for flow of laminated air or gas.

5. A building for manufacturing semiconductor devices under an ultra-clean environment comprising:
a central enclosure disposed therein for providing a central control area for dispersing of semiconductor wafers upon which said semiconductor devices are fabricated;
a floor;
a ceiling disposed above said floor;
a plurality of partitioning walls radiating radially outward from said central enclosure and disposed to form a plurality of spines around said central enclosure, said partitioning walls coupled to said floor and said ceiling;
a first separating wall disposed concentrically around said central enclosure and coupled to said floor, ceiling and plurality of partitioning walls, such that a plurality of fully enclosed clean rooms are formed concentrically around said central enclosure, said clean rooms for containing processing equipment for processing said semiconductor wafers;
each of said clean rooms being environmentally isolated from other of said clean rooms in order to form a minienvironment in each of said clean rooms, such that a breach of environmental integrity of one of said clean rooms does not disrupt environmental integrity of other of said clean rooms;
said central enclosure and said clean rooms having flow of ultra-pure air or gas in order to maintain ultra-clean minienvironments;
said central enclosure having an opening to each of said clean rooms for transferring said semiconductor wafers between said central enclosure and said clean rooms;
an automated wafer handler coupled to said central enclosure for transporting said semiconductor wafers within said central enclosure and between said central enclosure and said clean rooms through said openings;
wherein said semiconductor wafers are transported to various clean rooms for processing in said ultra-clean environment.

6. The building of claim 5 further comprising a second separating wall disposed concentrically around said first separating wall and coupled to said floor, ceiling and plurality of partitioning walls, such that a plurality of fully enclosed support rooms are formed outward and corresponding to each of said clean rooms in order to provide support areas for each of said clean rooms.

7. The building of claim 6 further comprising a third separating wall disposed concentrically around said second separating wall and coupled to said floor and ceiling in order to provide an access way around to said support areas.

8. The building of claim 7 wherein said clean rooms and support rooms include a suspended floor and ceiling for flow of laminar air or gas.

9. The building of claim 8 wherein said central enclosure further includes means for storing said semiconductor wafers.

10. The building of claim 9 wherein said central enclosure utilizes laminar flow of an ultra-pure non-reacting gas while said clean rooms and support rooms utilize laminar flow of ultra-pure air.

11. The building of claim 10 wherein said partitioning walls and said first separating wall are modular.

12. A multi-level building for manufacturing microelectronic devices under an ultra-clean environment comprising:
a central enclosure disposed therein and extending substantially the height of all levels for providing a central control area for dispersing of a material to all levels upon which said microelectronic devices are fabricated;
wherein each of said levels is comprised of:
a floor;
a ceiling disposed above said floor;
a plurality of partitioning walls radiating radially outward from said central enclosure and disposed to form a plurality of spines around said central enclosure, said partitioning walls coupled to said floor and said ceiling;
a first separating wall disposed concentrically around said central enclosure and coupled to said floor, ceiling and plurality of partitioning walls, such that a plurality of fully enclosed clean rooms are formed concentrically around said central enclosure, said clean rooms for containing processing equipment for processing said material;
each of said clean rooms being environmentally isolated from other of said clean rooms in order to form a minienvironment in each of said clean rooms, such that a breach of environmental integrity of one of said clean rooms does not disrupt environmental integrity of other of said clean rooms;
said central enclosure and said clean rooms having flow of ultra-pure air or gas in order to maintain ultra-clean minienvironments;
said central enclosure having an opening to each of said clean rooms for transferring said materials between said central enclosure and said clean rooms;
an automated material handler coupled to said central enclosure for transporting said material within said central enclosure and between said central enclosure and said clean rooms through said openings;
wherein said material is transported to various clean rooms for processing in said ultra-clean environment.

13. The multi-level building of claim 12 further comprising a second separating wall on each level disposed concentrically around said first separating wall and coupled to said floor, ceiling and plurality of partitioning walls, such that a plurality of fully enclosed support rooms are formed outward and corresponding to each of said clean rooms in order to provide support areas for each of said clean rooms on each level.

14. The multi-level building of claim 13 further comprising a third separating wall on each level disposed concentrically around said second separating wall and coupled to said floor and ceiling in order to provide an access way around to said support areas on each level.

15. The multi-level building of claim 14 wherein each of said clean rooms and support rooms include a suspended floor and ceiling for flow of laminar air or gas.

16. The multi-level building of claim 15 wherein said central enclosure further includes means for storing said material.

17. The multi-level building of claim 16 wherein said central enclosure utilizes laminar flow of an ultra-pure non-reacting gas while said clean rooms and support rooms utilize laminar flow of ultra-pure air.

18. The multi-level building of claim 16 wherein said material is a semiconductor wafer.

19. The multi-level building of claim 16 wherein its shape and the shape of said central enclosure are cylindrically shaped.

20. The building of claim 16 wherein said partitioning walls and said first separating wall are modular.

21. A method of fabricating microelectronic devices on a material under an ultra-clean environment in which processing steps for processing said material are conducted in separate and isolated minienvironments, comprising the steps of:

providing a manufacturing building having a central enclosure enclosed therein to function as a central control area for storing and dispersing of said material upon which said microelectronic devices are fabricated;

providing a plurality of clean rooms disposed concentrically around said central enclosure such that each of said clean rooms provides said isolated minienvironment, such that a break of environmental integrity of one of said clean rooms does not disrupt environmental integrity of other of said clean rooms;

providing ultra-pure air or gas flow in said central enclosure and said clean rooms in order to maintain an ultra-clean minienvironment;

providing an automated material handler coupled to said central enclosure for transporting said material within said central enclosure and between said central enclosure and said clean rooms;

wherein said material is transported and processed in various clean rooms under ultra-pure environment.

22. The method of claim 21 wherein said material is a semiconductor wafer and said microelectronics devices are semiconductor integrated circuits.

23. The method of claim 21 wherein said material is a glass substrate and said microelectronic devices are flat panel displays.

* * * * *

UNITED STATES PATENT AND TRADEMARK OFFICE
CERTIFICATE OF CORRECTION

PATENT NO. : 5,344,365

DATED : September 6, 1994

INVENTOR(S) : Richard G. Scott, Craig R. Shackleton, and Raymond W. Ellis

It is certified that error appears in the above-indentified patent and that said Letters Patent is hereby corrected as shown below:

Column 1, line 38, remove ",".

Column 1, line 67, "is" should be --are--.

Column 2, line 6, insert --,-- after "chemicals".

Column 4, line 15, insert --,-- after "air".

Column 4, line 19, insert --a-- after "of".

Column 4, line 28, remove "and".

Column 4, line 34, remove "and".

Column 4, line 42, remove "and".

Column 4, line 44, "an" should be --a--.

Column 4, line 55, "-" should be --.--.

Column 11, line 38, insert --an-- before "integral".

Column 12, line 47, "tool/and or" should be --tool and/or--.

Column 12, line 66, insert --of-- after "placement".

UNITED STATES PATENT AND TRADEMARK OFFICE
CERTIFICATE OF CORRECTION

PATENT NO. : 5,344,365

DATED : September 6, 1994

INVENTOR(S) : Richard G. Scott, Craig R. Shackleton, and Raymond W. Ellis

It is certified that error appears in the above-indentified patent and that said Letters Patent is hereby corrected as shown below:

Column 13, line 8, remove "a".

Column 13, line 45, "remain" should be --remains--.

Signed and Sealed this

Nineteenth Day of August, 1997

Attest:

BRUCE LEHMAN

Attesting Officer

Commissioner of Patents and Trademarks